United States Patent

Sadey et al.

[11] Patent Number: 6,042,711
[45] Date of Patent: Mar. 28, 2000

[54] METAL FOIL WITH IMPROVED PEEL STRENGTH AND METHOD FOR MAKING SAID FOIL

[75] Inventors: Richard J. Sadey, Parma; Dennis M. Zatt, Concord, both of Ohio

[73] Assignee: Gould Electronics, Inc., Eastlake, Ohio

[21] Appl. No.: 08/920,405

[22] Filed: Aug. 29, 1997

Related U.S. Application Data

[63] Continuation of application No. 08/022,797, Feb. 23, 1993, abandoned.

[51] Int. Cl.$^7$ .............................. C25D 5/10; C25D 5/12; C25D 7/06
[52] U.S. Cl. ............................................ 205/111; 205/181
[58] Field of Search ..................... 428/607, 612, 428/935, 926, 674, 675, 671, 642, 658, 647, 687; 205/111, 181, 182, 170, 291

[56] References Cited

U.S. PATENT DOCUMENTS

| | | | |
|---|---|---|---|
| Re. 30,180 | 12/1979 | Wolski et al. | 205/111 |
| 3,220,897 | 11/1965 | Conley et al. | 148/34 |
| 3,293,109 | 12/1966 | Luce et al. | 161/166 |
| 3,585,010 | 6/1971 | Luce et al. | 29/191.2 |
| 3,857,681 | 12/1974 | Yates et al. | 29/195 |
| 3,918,926 | 11/1975 | Wolski et al. | 428/612 |
| 4,311,768 | 1/1982 | Berdan et al. | 428/626 |
| 4,456,508 | 6/1984 | Torday et al. | 204/27 |
| 4,549,940 | 10/1985 | Karwan | 205/111 |
| 4,549,950 | 10/1985 | Polan et al. | 204/206 |
| 4,572,768 | 2/1986 | Wolski et al. | 204/15 |
| 4,961,828 | 10/1990 | Lin et al. | 205/155 |
| 5,207,889 | 5/1993 | Wolski et al. | 105/155 |

FOREIGN PATENT DOCUMENTS 1349696  4/1974  United Kingdom .

*Primary Examiner*—John J. Zimmerman
*Attorney, Agent, or Firm*—Michael A. Centanni

[57] ABSTRACT

A metallic foil with improved peel strength is disclosed which has on a surface thereof two superimposed electrodeposited layers, the first layer adjacent to said surface comprising a dusty dendritic deposit comprising a major amount of a first metal and the second layer comprising a metal flash uniformly deposited over said first layer comprising a major amount of a second metal other than said first metal. A method for making such foil is disclosed which comprises (A) electrodepositing a first metal on one surface of said foil to produce a dusty dendritic metal deposit and (B) electrodepositing on the dendritic deposit of (A) a uniform metal flash. The improved foil is useful for a wide range of applications that benefit from the improved bonding to substrates, including electronic applications such as laminated electronic devices, such as printed circuit boards, and solid state switches.

9 Claims, 2 Drawing Sheets

NO DUST

DUSTY

VERY DUSTY

METAL FOIL WITH IMPROVED PEEL STRENGTH AND METHOD FOR MAKING SAID FOIL

This is a continuation of application Ser. No. 08/022,797 filed on Feb. 23, 1993 now abandoned.

TECHNICAL FIELD

This invention relates to treatment of electrode-posited metal foils used to make electronic devices such as printed circuit boards and a process for making such foils. In particular, the present invention relates to surface treatment of metal foils for improving adhesion between dusty high profile dendritic metal deposits and metal foil substrates. The invention is useful in the field of electrical and electronic devices, including laminated electronic devices such as printed circuit boards (PCBs).

BACKGROUND OF THE INVENTION

Metal foil, such as copper foil, has become widely used in a wide variety of electronic and electrical component technologies. A separate field of technology has developed for the production of metal foils useful in such industries to achieve properties useful for various applications. Commercially, the primary means by which desirable properties are added to metal foil is by electrodeposition of metals from metallic ion-containing baths. Such processes have been used to produce a matte surface having microscopic dendritic (i.e., tree-like or nodular) structures to aid in adhering the foil surface to other materials. Electrodeposition has also been used to apply certain metals as a thermal barrier, an elevated temperature metal diffusion barrier, an oxidation barrier, a chemical corrosion barrier, and/or provide certain electrical properties such as electric current resistance.

After it has been treated to achieve the aforementioned properties, metal foils, such as copper, tin and nickel foils, are particularly well suited for use in various electronic and electrical components. Of particular interest are printed circuit boards and PCB components, especially multilayer PCB laminates, solid state switches and the like which have been developed to meet the demand for miniaturization of electronic components and the need for PCBs having a high density of electrical connections and circuitry. The technologies for the production of copper foils by electrodeposition from electroplating baths and/or processing the metal in a roll mill are well known in the art.

A typical example of production of a metal foil for electronic applications is the production of copper foil by electrodeposition processes. Such processes generally involve the use of an electroforming cell (EFC) consisting of an anode and a cathode, an electrolyte bath solution, generally containing copper sulfate and sulfuric acid, and a source of current at a suitable potential. When voltage is applied between the anode and cathode, copper deposits on the cathode surface.

The copper foil making process begins by forming the electrolyte solution, generally by dissolving (or digesting) a metallic copper feed stock in sulfuric acid. After the copper is dissolved the solution is subjected to an intensive purification process to ensure that the electrodeposited foil contains no disruptions and/or discontinuities. Various agents for controlling the properties may be added to the solution.

The solution is pumped into the EFC and when voltage is applied between the anode and cathode, electrodeposition of copper occurs at the cathode. Typically, the process involves the use of rotatable cylindrical cathodes (drums) that may be of various diameters and widths. The electrodeposited foil is then removed from the cylindrical cathode as a continuous web as the cathode rotates. The anodes typically are configured to conform to the shape of the cathode so that the separation or gap therebetween is constant. This is desirable in order to produce a foil having a consistent thickness across the web. Copper foils prepared using such conventional electrodeposition methodology have a smooth shiny (drum) side and a rough or matte (copper deposit growth front) side.

Conductive foils for PCB applications and other electronic devices are conventionally treated, at least on the matte side, for enhanced bonding and peel strength between the matte side and the laminate. Typically the foil treatment involves treatment with a bonding material to increase surface area and thus enhance bonding and increase peel strength. The foil may also be treated to provide a thermal barrier, which may be brass, to prevent peel strength from decreasing with temperature. Finally, the foil may be treated with a stabilizer to prevent oxidation of the foil. These treatments are well known in the art.

Recently, there has been a need for conductive foils exhibiting improved peel strength and capable of enduring thermomechanical stress due to increasing reliance upon electronic components in harsh environments. Electronically controlled devices are becoming more common under the hoods of vehicles, such as cars, trucks, and heavy equipment, for microprocessor control of combustion conditions and in equipment used in industrial environments which subject the circuits to high temperatures and/or mechanical stress such as electronic chemical or metallurgical process control equipment, robotic equipment, etc. Stress may also be induced due to harsh geographical environments.

Attempts to increase peel strength by deposition of a high profile dendritic metal electrodeposit on metallic foil have been limited due to a formation of what is known as a "dusty" or "very dusty" deposit. The "dusty" nature of electrodeposited layer is due to the formation of large nodules having insufficient dendritic support, resulting in large numbers of nodules becoming easily detached from the foil to form the loose "dusty" surface. Dusty high profile electrodeposits have low or inadequate peel strengths due to this weakness in the dendritic anchoring of the foil to another substrate, such as laminate.

Not only is peel strength effected, but another problem arises, known as "treatment transfer" in which the electrodeposited metal separates from the foil as metal particles and becomes imbedded in the laminating material. This is undesirable since such particles could cause unintended flows of electrons (i.e., short circuits) between what would otherwise be insulated layers of conductive material in the multilayer circuit board laminates.

The present invention provides a procedure for obtaining a metallic foil having a nodular high profile dendritic metal deposit which does not suffer from the aforementioned drawbacks and provides additional desirable properties.

SUMMARY OF THE INVENTION

One aspect of the present invention is a metallic foil having on a surface thereof two superimposed electrodeposited layers, the first layer adjacent to said surface comprising a dusty dendritic deposit comprising a major amount of a first metal and the second layer comprising a metal flash uniformly deposited over said first layer comprising a major amount of a second metal other than said first metal.

In another aspect of the present invention, the present invention is a process for making foil having improved peel strength comprising (A) electrodepositing a first metal on one surface of said foil to produce a dusty dendritic metal deposit and (B) electrodepositing over the dendritic deposit of (A) a uniform metal flash.

Another aspect of the present invention is producing an electronic device from the metallic foil of the present invention. Included as electronic devices are devices comprising a laminated metallic foil of the present invention, such as the PCBs described above, and solid state switches, including solid state circuit breakers.

DESCRIPTION OF THE PREFERRED EMBODIMENTS

For the purpose of the present invention, the term "dendritic" as used herein refers to microscopic metallic structures on a metallic surface which have a tree-like or nodular appearance. Methods for obtaining dendrites on a metallic foil are well known in the art. Typically, dendrites can be obtained for most electrodepositable metals by conducting electrodeposition with a bath containing metal ions at a lower concentration and a substantially higher current density than that normally used to obtain a smooth electroplated finished product. Other conditions, such as pH, bath temperature and bath additives, can be used to further encourage the formation of dendritic deposits. U.S. Pat. No. 3,328,275 and Bucci et al, "Copper Foil Technology", PC FAB (July 1986), pp. 22–31, each fully incorporated herein by reference, describe typical processes for producing dendritic deposits on copper foil.

The term "metal flash" as used herein refers to a thin metallic electrodeposited coating having a low profile relative to the surface on which it is deposited. It is non-dendritic, as opposed to the dendritic surface described above. The metal flash is typically produced by utilizing electrodeposition conditions contrary to those required for dendritic deposits, namely high metal ion concentration in the electrodeposition bath and low current density relative to the concentration and current density used for dendritic deposits. Other factors, such as pH, bath temperature and bath additives, may be used to facilitate electrodeposition of a non-dendritic coating.

Figure 1:
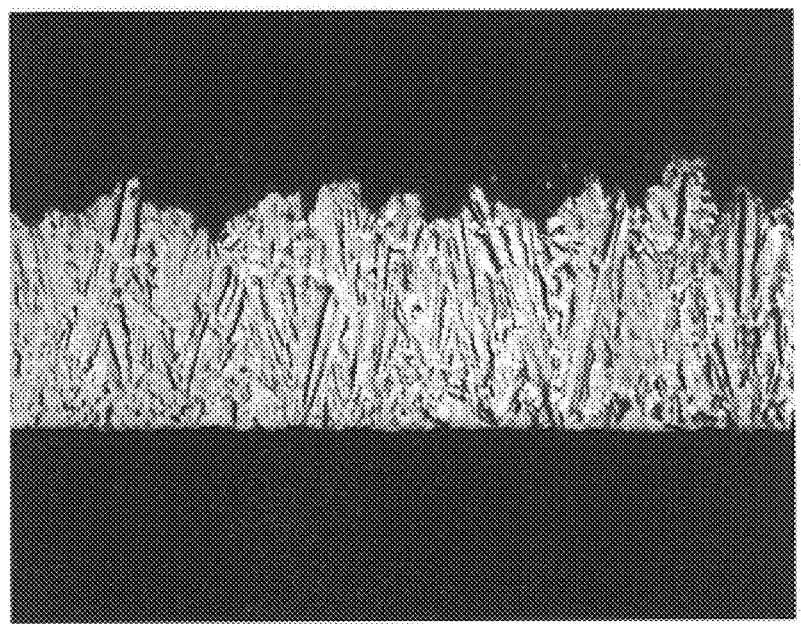
FIG. 1 is a photomicrograph showing a 1000× magnification of a cross-section of copper foil etched with acid having a dusty dendritic copper deposit on the upper matte side and a lower smooth side in accordance with step (A) of the process of the present invention.

In the present invention, the metal flash is generally applied at a thickness which is less than the profile of the dendritic layer on which it is being deposited. Typically, the metal flash has an average cross-sectional thickness no greater than 20% of the average height of the dendrite from the metallic foil relative to the average depth of the valleys between dendrites (referred to hereinafter as the "average profile height"). The average profile height may be determined based on photomicrographs such as those of FIGS. 1 and 2.

In a preferred embodiment, the average thickness of the metal flash is no greater than about 10% of average profile height. In one embodiment, the average thickness of the metal flash is not more than about 5% of average profile height. The average thickness of the metal flash may be 10 microns or more. However, for most applications, the average thickness is generally not be more than about 3.0 microns. In one embodiment, the average thickness may not be more than about 1.5 microns.

Figure 2:
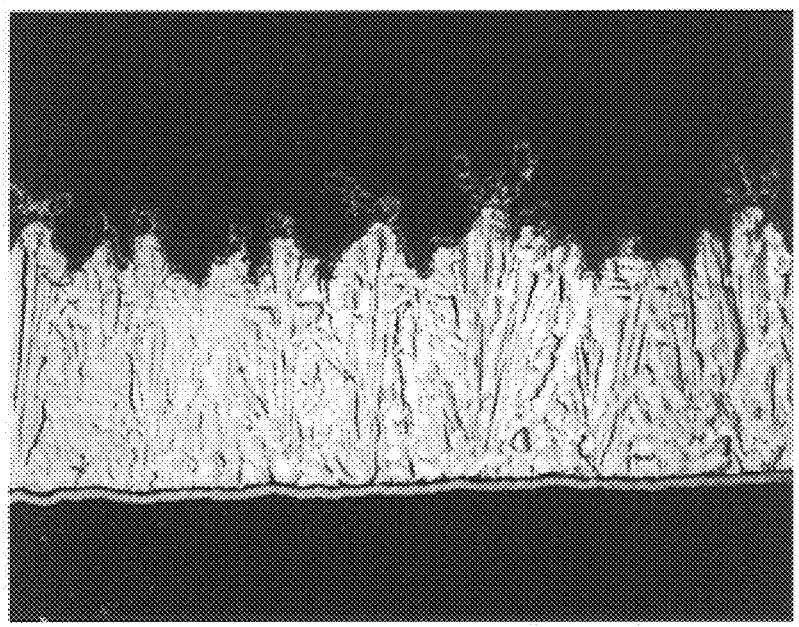
FIG. 2 is a photomicrograph showing a 1000× magnification of a cross-section of the copper foil of FIG. 1 coated with a nickel flash in accordance with step (B) of the process of the present invention which has been soaked in acid to etch away the copper under the nickel flash to more clearly show the contours of the nickel flash over the high profile copper deposit.

The thickness of the metal flash can be measured by conventional automated devices used in the metal foil plating industry and the average profile height can be determined from scanning electron microscope (SEM) photomicrographs of sample cross-sections such as that in FIG. 2. Once the appropriate electrodeposition conditions are determined, consistent results can be obtained.

To follow the contours of the dendrites, it is preferred that the metal flash have a fine grain structure relative to the grain structure of the dendritic layer below. Applying such a fine-grained coating generally facilitates application of a uniform metal flash to "dusty" dendritic substrates.

Figure 3:
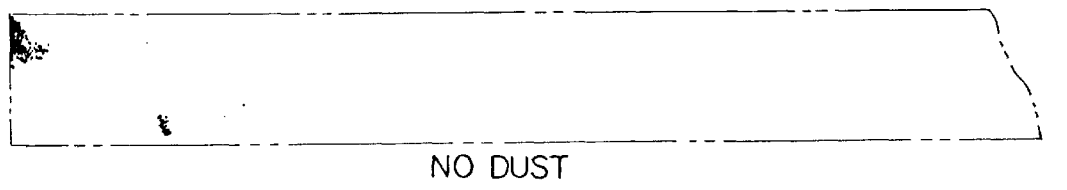
FIG. 3 is a photocopy (1:1) of samples of transparent tape from "non-dusty", "dusty" and "very dusty" copper foil adhered to blank white paper.
Figure 3:
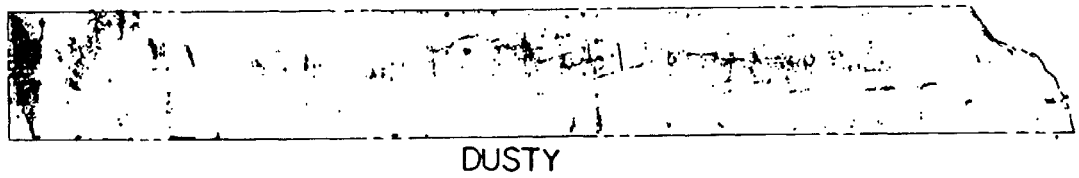
Figure 3:

The "dusty" dendritic deposits can be distinguished from non-dusty deposits by a simple standard qualitative test. An adhesive tape of the type known as Scotch brand™ (3M) transparent tape is firmly applied to the matte side, stripped off at a 90 degree angle and applied to a white sheet of paper. If hardly any trace of metal particles adhered to the tape, the deposit is considered non-dusty. If more than a trace appears on the tape, it is considered a "dusty" deposit. FIG. 3 shows three adhesive tape samples corresponding to "non-dusty", "dusty" and "very dusty".

One of the more important factors in determining whether electrodeposition will result in non-dendritic or dendritic surface structure is current density. Typically, current density to produce non-dendritic surface structure will often be not more than about one-half the current density used to produce dendritic surface structure for the same metal being electrodeposited. In a preferred embodiment, the current density used to apply the metal flash is not more than about one-third of the current density used to produce a dendritic layer.

A nickel flash, for example, can typically be electrodeposited at a current density not more than about 300 amperes per square foot (ASF), and often at a current density not more than about 200 ASF. In one embodiment, a nickel flash is obtained by electrodeposition of nickel from a nickel electrodeposition bath at a current density of about 100 to about 150 ASF.

Another factor influencing whether electrodeposition results in non-dendritic or dendritic deposition is metal ion concentration in the electrodeposition bath. In general, the metal ion concentration in the bath used to apply the metal flash is at least twice that of the metal ion concentration used to apply a dendritic layer. In one embodiment, a nickel flash is obtained by electrodeposition of nickel from a nickel electrodeposition bath containing from about 85 to about 115 grams of nickel per liter of electrodeposition bath.

The pH and temperature conditions favorable toward non-dendritic or dendritic deposition vary from metal to metal. In the case of nickel, nickel flash deposition is often carried out in an aqueous bath having a pH up to 5.0 and at an elevated temperature of at least 30° C.

The time periods required for electrodeposition of the dusty deposit and the subsequent metal flash layer vary depending on current density, metal ion concentration, pH, temperature and the particular metal being deposited. In one embodiment, a dusty deposit may be obtained by electrodeposition over a period in the range from about 10 to about 20 seconds and a nickel flash may be obtained by electrodeposition over a period of about 30 seconds to about 1 minute.

A dusty dendritic metal deposit may generally be obtained when electrodeposition is conducted at a higher current density and a lower metal ion concentration than the current density and metal ion concentration used to obtain a corresponding non-dusty dendritic metal deposit. There is often a correlation between non-dusty and low profile deposition conditions, and between dusty and high, or very high, profile deposition conditions, but dustiness and average profile height are considered to be independent concepts with regard to this invention. For example, a high profile deposit may be dusty or non-dusty. In one embodiment, dusty (and high profile) dendritic copper may be obtained when the current density is in the range from about 250 to about 400 ASF, the copper ion concentration is in the range from about 24 to about 26 grams per liter of electroplating bath, and the bath temperature is in the range from about 90° F. to about 110° F. and the sulfuric acid concentration is in the range from about 90 to about 110 grams per liter of bath. Three to four grams of a nitrate per liter and about 22 to about 28 ppm chloride ion may be present to facilitate dusty copper deposition.

A wide variety of metals can be utilized in making the foil of the present invention. The metallic foil can be made of any conductive metal. The first metal used to form the dendritic deposit on the metallic foil can also be selected from a wide variety of conductive metals capable of being electroplated. Typically, a metal is chosen which has good adhesion to the metallic foil upon electrodeposition under dendritic electrodeposition conditions. When the metallic foil is a copper foil, the first metal is generally copper, although zinc may also be used to form a dendritic zinc layer such as described in U.S. Pat. No. 4,456,508, which is fully incorporated herein by reference.

The second metal, used as a metal flash in the second layer is generally any metal which is capable of depositing according to the characteristics of a metal flash described above. Examples include nickel, tin, palladium, platinum, silver, gold and indium.

Additional layers of electrodeposited metals may be included in the improved metal foil of the present invention. A layer of brass, for example, may be interposed between the dendritic first layer and the metal flash second layer to provide a thermal barrier. A thermal barrier is useful, for instance, to prevent peel strength from decreasing with increasing temperature when used in laminated printed circuit board applications involving high thermomechanical stress. Intermediate layers interposed between any dendritic layer and any subsequent layer should be deposited such that it does not substantially destroy the dendritic nature of the layer below, such as by filling the valleys between dendrites or bridging between the dendrite nodules.

As mentioned above, the metallic foils of the present invention can be used in a wide variety of applications which require a bondable conductive metallic foil. Typical applications include electrical and electronic applications in which a metallic foil is bonded to a substrate. Metallic foil laminates may be formed using the metallic foil of the present invention to form electronic devices, such as PCBs and solid state switches, capable of withstanding thermal and/or mechanical stress while maintaining good adhesion to the laminating material. Improved peel strengths and reduced treatment transfer are advantageous properties in the electronics field exhibited by the present invention, while additional valuable properties are obtained due to the presence of a major amount of at least one other metal on the metallic foil. In one embodiment, the average peel strength is at least about 10 lbs. per inch, often is at least about 12 lbs. per inch, and may be about 16 or more lbs. per inch.

One embodiment which may be used to illustrate the present invention is a nickel treatment process on copper treatment. This process may be described as follows:

(1) Obtain a copper foil having a dusty high profile dendritic matte side obtained by electrodeposition of copper under conditions which form dusty copper dendrites;

(2) Optionally treat the matte side of the copper foil of step (1) with an intermediate electrodeposited metal layer, such as brass as a thermal barrier, provided that this intermediate layer does not substantially destroy the dendritic nature of the deposit on the matte side of the foil of step (1); and (3) Apply a nickel flash to the matte surface of step (1) or step (2).

Copper foil treated in the above manner is found to have higher peel strength and less treatment transfer than when the third step is applied directly to the matte side of the copper foil.

The following examples are provided for the purpose of illustrating the invention. Unless otherwise indicated, in the following examples, as well as throughout the specification and claims, all parts and percentages are by weight, all temperatures are in degrees Centigrade, all pressures are atmospheric, and process conditions are at standard pressure and temperature (i.e., at 25° C. and 1 atmosphere).

EXAMPLE 1

A copper foil having a smooth side and a matte side, the matte side having a dusty high profile electrodeposited dendritic copper deposit, is processed through a nickel flash electrodeposition bath. The conditions of the nickel bath are as follows:

100±15 grams per liter Ni

40±5 grams per liter boric acid

4±0.5 pH

110±5° F.

100–150 ASF current density

The term "ASF" refers to "amperes per square foot."

A cross-sectional view of copper foil after it has undergone electrodeposition in the nickel bath is shown in FIG. 2. The copper foil appears as the lighter-shaded coarser-grained major portion of the cross-section material and the nickel flash appears as the slightly darker fine-grained material along the upper and lower contours of the copper foil material. The upper portion with the rough profile is the matte side of the copper foil. The cross-section has been etched by immersing the section in an acid bath to dissolve some of the copper. The resulting cross-section reveals the grain structure of the copper in the foil and the contours of the nickel flash along the copper. Dark areas between the copper foil and nickel flash are voids created by the acid etching copper from between the copper foil and nickel flash.

EXAMPLE 2

The copper foil of this example is treated in the same manner as that of Example 1, except that prior to processing the copper foil in the first bath, the matte side of the standard low profile copper foil is first treated with a brass electrodeposited coating to provide a thermal barrier. The results obtained after treatment with the first and second baths of Example 1 are otherwise closely analogous.

This example demonstrates that a copper foil can be treated according to the process of the present invention regardless of the presence of additional intermediate layers providing additional functional attributes.

EXAMPLE 3

Copper foil is treated according to the process of Example 1, except the copper foil used in this example has a very dusty dendritic copper deposit on the matte side as determined by a standard qualitative tape adhesion test described above.

EXAMPLE 4

Copper foil is treated according to the process of Example 2 using as the copper foil the very dusty foil of Example 3, which is first treated with a brass electrodeposited coating to provide a thermal barrier.

Each of Examples 1–4 (a) before nickel flash treatment and (b) after nickel flash treatment according to the present invention were tested for peel strength using a standard peel strength test. The standard peel strength test is based on GE-FR4™ lamination in which 4 inch by ½ inch samples are placed matte side down on one sheet of GE-16012™ prepreg, which is on top of three sheets of GE-16013™ prepreg, and then laminated at 350° F. for 40 minutes at 1000 psi pressure. Peel strength is then measured at room temperature with a standard peel strength measuring device (Instron™), which measures the force required to pull the copper foil from the laminate at a 90 degree angle. The force required is expressed in pounds per inch (measured over a peel distance of at least one inch).

Nickel layer thickness may be measured using an Asoma Model 8620™ which measures nickel thickness by X-ray fluorescence.

The results obtained with the present invention compared with the results obtained with dusty copper foil before nickel flash treatment are shown in Table I below:

TABLE I

Peel Strength and Nickel Thickness Results

| Example No. | Treatment Stage | Average Peel Strength (lbs/inch) | Nickel Thickness in Microns on Matte Side |
|---|---|---|---|
| 1 | Before Ni flash | 8.4 | — |
|   | After Ni flash | 10.1 | 1.1 |
| 2 | Before Ni flash | 10.3 | — |
|   | After Ni flash | 11.6 | 1.0 |
| 3 | Before Ni flash | 10.0 | — |
|   | After Ni flash | 16.5 | — |
| 4 | Before Ni flash | 13.0 | — |
|   | After Ni flash | 17.0 | — |

As can be seen from these results, the foil prepared according to the present invention has a higher peel strength than the untreated dendritic copper foil. The inventors have also observed reduced treatment transfer when practicing this invention.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed:

1. A process for making a treated metallic foil having improved peel strength comprising the steps of:

(A) electrodepositing a dusty dendritic layer of copper on one surface of a metal foil, wherein the current density Is applied in the range of about 250 ASF to about 400 ASF, a copper ion concentration in the range from about 24 to about 26 grams per liter, a bath temperature in the range from about 90° F. to 110° F., and a sulfuric acid concentration in the range from about 90 to about 110 grams per liter; and (B) electrodepositing on the surface of the dusty dendritic deposit of step (A) a uniform metal flash major amount of of a metal other than copper to provide a treated metallic foil exhibiting a peel strength of at least 12 pounds per inch based upon GI-FR4™ lamination.

2. The process of claim 1 wherein step (A) is conducted at a nitrate concentration in the range from 3 to 4 g/l of electroplating bath.

3. The process of claim 1 wherein the metal flash applied in step (B) is nickel.

4. The process of claim 1 wherein step (A) is conducted at a chloride concentration in the range from about 22 to about 28 ppm of electroplating bath.

5. The process of claim 1 wherein step (B) is conducted at an average current density less than about 300 ASF.

6. The process of claim 1 wherein step (B) is conducted at an average current density less than about 200 ASF.

7. The process of claim 1 wherein step (B) comprises immersing said foil in an aqueous bath having a pH up to about 5.0 and maintained at an elevated temperature of at least about 30° C. comprising at least 60 grams per liter nickel.

8. The process of claim 1 wherein the metal flash has an average thickness not more than about 10% of the average profile height of the dusty dendritic deposit.

9. The process of claim 1 wherein the metal flash has an average thickness not more than about 5% of the average profile height of the dusty dendritic deposit.

* * * * *

UNITED STATES PATENT AND TRADEMARK OFFICE
CERTIFICATE OF CORRECTION

PATENT NO.      : 6,042,711
DATED           : March 28, 2000
INVENTOR(S)     : Sadey et al.

It is certified that error appears in the above-identified patent and that said Letters Patent is hereby corrected as shown below:

Title page,
Item [63], Related U.S. Application Data, replace "Continuation of application No. 08/022,797, Feb. 23, 1993, abandoned." with -- Continuation of application No. 08/022,792, Feb. 23, 1993, abandoned, which is a continuation of application No. 07/722,976, June 28, 1991, abandoned. --

Signed and Sealed this

Twenty-second Day of March, 2005

JON W. DUDAS
*Director of the United States Patent and Trademark Office*